United States Patent
Shoji et al.

(10) Patent No.: US 7,358,535 B2
(45) Date of Patent: Apr. 15, 2008

(54) PHOTO-COUPLER SEMICONDUCTOR DEVICE AND PRODUCTION METHOD THEREFOR

(75) Inventors: Hiroyuki Shoji, Nara (JP); Hideya Takakura, Nara (JP); Kazuo Kusuda, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 234 days.

(21) Appl. No.: 10/747,403

(22) Filed: Dec. 30, 2003

(65) Prior Publication Data
US 2004/0149995 A1 Aug. 5, 2004

(30) Foreign Application Priority Data
Jan. 17, 2003 (JP) ............... 2003-009991
Sep. 12, 2003 (JP) ............... 2003-321627

(51) Int. Cl.
*H01L 21/00* (2006.01)
(52) U.S. Cl. ............... 257/81; 257/433; 257/436
(58) Field of Classification Search ............... None
See application file for complete search history.

(56) References Cited

U.S. PATENT DOCUMENTS 4,114,177 A * 9/1978 King ............... 257/81
4,412,135 A * 10/1983 Awaji ............... 250/551
5,770,867 A * 6/1998 Sata et al. ............... 257/81
6,737,680 B2 * 5/2004 Hasegawa ............... 257/82

FOREIGN PATENT DOCUMENTS

| JP | 61-83062 U | 6/1986 |
| JP | 62-185075 U | 11/1987 |
| JP | 08-125216 | 5/1996 |
| JP | 11-177124 | 7/1999 |
| JP | 11-177124 A | 7/1999 |
| JP | 11177124 A * | 7/1999 |

* cited by examiner

*Primary Examiner*—Leonardo Andujar
(74) *Attorney, Agent, or Firm*—Birch, Stewart, Kolasch & Birch, LLP

(57) ABSTRACT

A photo-coupler semiconductor device includes first and second planar lead frames each having a main portion and a distal portion, a light emitting element and a light receiving element respectively mounted on upper surfaces of the distal portions of the first and second lead frames, a light-transmitting resin member which covers the light emitting element and the light receiving element, and supports the distal portions of the first and second lead frames in spaced opposed relation with the light emitting element and the light receiving element being mounted on the upper surfaces of the distal portions so that the main portions of the first and second lead frames are located in coplanar relation, and a opaque resin member which covers the light-transmitting resin member, and supports the main portions of the first and second lead frames. The light-transmitting resin member and the opaque resin member are each composed of an epoxy resin as a base resin.

9 Claims, 13 Drawing Sheets

PHOTO-COUPLER SEMICONDUCTOR DEVICE AND PRODUCTION METHOD THEREFOR

CROSS-REFERENCE TO RELATED APPLICATIONS

This application is related to Japanese patent application Nos. 2003-009991 (filed on Jan. 17, 2003) and 2003-321627 (filed on Sep. 12, 2003), whose priorities are claimed under 35 USC § 119, the disclosures of which are incorporated by reference in their entirety.

BACKGROUND OF THE INVENTION

1. Field of the Invention

The present invention relates to a photo-coupler semiconductor device (photo-coupler) and to a production method therefor.

2. Description of the Related Art

Japanese Unexamined Patent Publication No. Hei 11-177124 (1999), for example, discloses a prior-art photo-coupler related to the present invention, which is designed so that light emitted from a light emitting element is received by a light receiving element. The light emitting element and the light receiving element are located in opposed relation on die pads of first and second lead frames, respectively, which are inclined with respect to each other, and encapsulated in an encapsulant of a light-transmitting silicone resin. Thus, at least a part of the light emitted from a major surface of the light emitting element parallel to a mount surface is directly incident on the light receiving element without reflection. The patent publication also discloses a photo-coupler production method, in which the encapsulant is applied over the lead frames respectively mounted with the light emitting element and the light receiving element, then formed into a predetermined shape by gravity and cured, whereby the light emitting element and the light receiving element are embedded in the encapsulant on the lead frames.

With a recent trend toward a higher board mounting temperature due to elimination of lead-containing components, it is indispensable to improve the heat resistance of a package of the photo-coupler semiconductor device. However, the silicone resin to be used for covering the light emitting element and the light receiving element to form a light transmission path has a high linear expansion coefficient, so that the resulting package is liable to crack due to a thermal stress occurring therein when it is mounted. Further, the aforesaid production method involving the embedding of the light emitting element and the light receiving element in the encapsulant is not suitable for mass production, because the shape of the cured encapsulant is unstable.

SUMMARY OF THE INVENTION

In view of the foregoing, a photo-coupler semiconductor device is disclosed which has a double transfer-molded structure of epoxy resins each having a low linear expansion coefficient and is high in light transmission efficiency, as well as a production method suitable for mass production of such a photo-coupler semiconductor device.

In particular, a photo-coupler semiconductor device which comprises: first and second planar lead frames each having a main portion and a distal portion; a light emitting element and a light receiving element respectively mounted on upper surfaces of the distal portions of the first and second lead frames; a light-transmitting resin member which covers the light emitting element and the light receiving element, and supports the distal portions of the first and second lead frames in spaced opposed relation with the light emitting element and the light receiving element being mounted on the upper surfaces of the distal portions so that the main portions of the first and second lead frames are located in coplanar relation; and a opaque resin member which covers the light-transmitting resin member, and supports the main portions of the first and second lead frames; wherein the light-transmitting resin member and the opaque resin member are each composed of an epoxy resin as a base resin.

The light emitting element and the light receiving element are covered with the epoxy resin, so that the photo-coupler semiconductor device is high in efficiency of light transmission between the light emitting element and the light receiving element and excellent in heat resistance.

Furthermore, a production method for a photo-coupler semiconductor device is disclosed which comprises the steps of: providing a unitary frame having first and second lead frames; mounting a light emitting element and a light receiving element on upper surfaces of distal portions of the first and second lead frames, respectively; forming a light-transmitting resin member by primary transfer molding of a light-transmitting resin so as to cover the distal portions of the first and second lead frames, the light emitting element and the light receiving element with the light-transmitting resin member; and forming a opaque resin member by secondary transfer molding of a opaque resin so as to cover the light-transmitting resin member with the opaque resin member.

In the production method the light-transmitting resin member and the opaque resin member are formed by the primary and secondary transfer molding processes, so that the photo-coupler semiconductor device can stably be mass-produced.

DETAILED DESCRIPTION OF THE INVENTION

Figure 1:
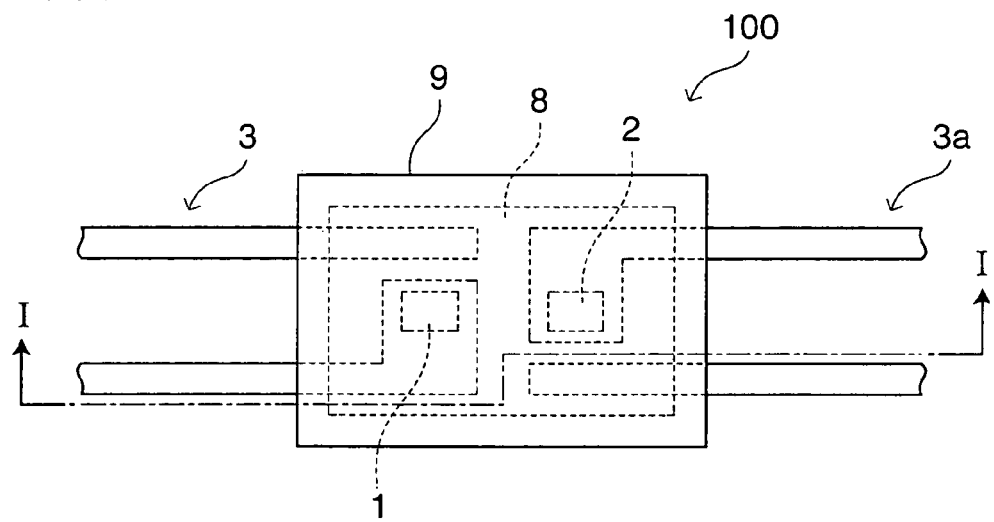
FIG. 1 is a plan view illustrating a photo-coupler according to a first embodiment of the present invention.

A photo-coupler semiconductor device according to the present invention comprises: first and second planar lead frames each having a main portion and a distal portion; a light emitting element and a light receiving element respectively mounted on upper surfaces of the distal portions of the first and second lead frames; a light-transmitting resin member which covers the light emitting element and the light receiving element, and supports the distal portions of the first and second lead frames in spaced opposed relation with the light emitting element and the light receiving element being mounted on the upper surfaces of the distal portions so that the main portions of the first and second lead frames are located in coplanar relation; and a opaque resin member which covers the light-transmitting resin member, and supports the main portions of the first and second lead frames; wherein the light-transmitting resin member and the opaque resin member are each composed of an epoxy resin as a base resin.

A portion of the light-transmitting resin member above the light emitting element and the light receiving element has a generally hemispherical shape. Alternatively, the portion of the light-transmitting resin member above the light emitting element and the light receiving element has a generally truncated quadrangular pyramid shape.

A unitary frame is advantageously employed, in which the first and second lead frames are located in coplanar relation. The light emitting element and the light receiving element comprise a light emitting diode and a photo diode, respectively.

Examples of the epoxy resin for the light-transmitting resin member include a transparent epoxy resin and a translucent epoxy resin. Examples of the epoxy resin for the opaque resin member include a white epoxy resin and a light blocking epoxy resin, i.e., an epoxy resin which contains additives for giving a light blocking effect, such as white or black inorganic fine powders.

Preferably, the distal portions respectively mounted with the light emitting element and the light receiving element are gently inclined downward with respect to the main portions. The inclination angles of the respective distal portions are properly determined so that the light receiving element can efficiently receive light emitted from the light emitting element directly or after reflection. In this case, the distal portion mounted with the light emitting element is inclined at a smaller angle than the distal portion mounted with the light receiving element.

The distal portion mounted with the light emitting element is inclined downward at an angle a, and the distal portion mounted with the light receiving element is inclined downward at an angle b, wherein the angles a and b satisfy the following expressions:

$$5° \leq a \leq 25°, 5° \leq b \leq 25°$$

The light-transmitting resin member includes an upper portion which guides the light from the light emitting element to the light receiving element, and a lower portion which supports the distal portions of the first and second lead frames. The upper portion is smaller in volume than the lower portion.

The light-transmitting resin member has an outer peripheral surface, and the upper surfaces of the distal portions preferably each form an angle of 45 to 90 degrees with respect to a portion of the outer peripheral surface adjacent thereto.

The distal portion of the first lead frame may have a step such that the light emitting element is located at a lower level than an upper surface of the main portion of the first lead frame. The light emitting element may partly be covered with a light-transmitting silicone resin.

A production method for a photo-coupler semiconductor device according to the present invention comprises the steps of: providing a unitary frame having first and second lead frames; mounting a light emitting element and a light receiving element on upper surfaces of distal portions of the first and second lead frames, respectively; forming a light-transmitting resin member by primary transfer molding of a light-transmitting resin so as to cover the distal portions of the first and second lead frames, the light emitting element and the light receiving element with the light-transmitting resin member; and forming a opaque resin member by secondary transfer molding of a opaque resin so as to cover the light-transmitting resin member with the opaque resin member.

In this method, the unitary frame having the first and second lead frames is utilized for the formation of the resin members by the molding, so that the number of steps can be reduced.

The production method preferably further comprises the step of bending the distal portions respectively mounted with the light emitting element and the light receiving element by pressing down the distal portions. In this case, the same mold is employed in the bending step and the primary transfer-molding step, and the bending step is preferably performed when the mold is clamped. With this arrangement, the bending step and the primary transfer-molding step are performed with the use of the same mold, so that the simplification of the processing facility and the reduction in the number of steps can be achieved.

The mold may comprise an upper mold half and a lower mold half, and the upper mold half may have a projection for the bending. The lower mold half may have a support portion for supporting back sides of the bent distal portions.

The first and second lead frames preferably each comprise an element mount frame on which the corresponding element is mounted and a signal frame for receiving and transmitting an electrical signal from/to the element, the element mount frame and the signal frame being arranged in parallel relation. In this case, the element mount frames and the signal frames of the first and second lead frames are preferably simultaneously bent in the bending step.

The projection may comprise a pin movable in such a direction that the distal portions are bent.

The projection may comprise a first projection for bending the first lead frame and a second projection for bending the second lead frame. The first and second projections preferably each comprise a pin movable in such a direction that the corresponding distal portion is bent.

The projection may comprise a pin movable in such a direction that the distal portions of the first and second lead frames are simultaneously bent.

The present invention also provides an electronic apparatus, such as a TV power supply or a portable-phone charger, which comprises the aforesaid photo-coupler semiconductor device.

With reference to the attached drawings, the present invention will hereinafter be described in detail by way of embodiments thereof. It should be understood that the invention be not limited to these embodiments.

First Embodiment

Figure 2:
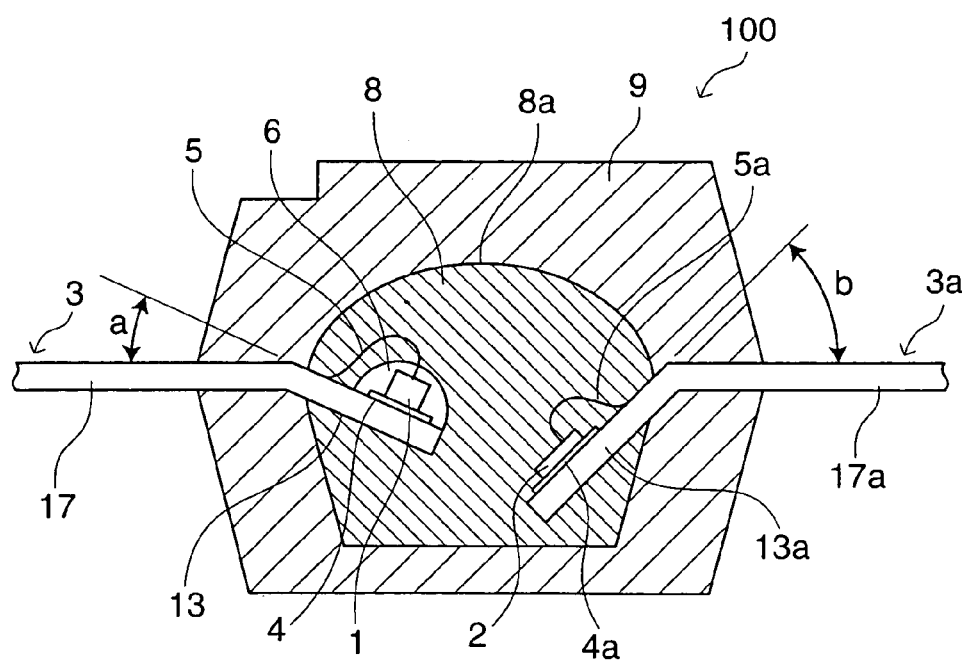
FIG. 2 is a sectional view of the photo-coupler as seen in an arrow direction I-I in FIG. 1.

FIG. 1 is a plan view illustrating a photo-coupler semiconductor device (hereinafter referred to simply as "photo-coupler") according to a first embodiment of the present invention, and FIG. 2 is a sectional view of the photo-coupler as seen in an arrow direction I-I in FIG. 1. As shown, the photo-coupler 100 includes a light emitting element 1 and a light receiving element 2 which are bonded to upper surfaces of distal portions 13 and 13a of first and second planar lead frames 3 and 3a by silver paste portions 4 and 4a, respectively, and are electrically connected (or wire-bonded) to the first and second lead frames 3 and 3a via gold wires 5 and 5a, respectively.

Figure 3:
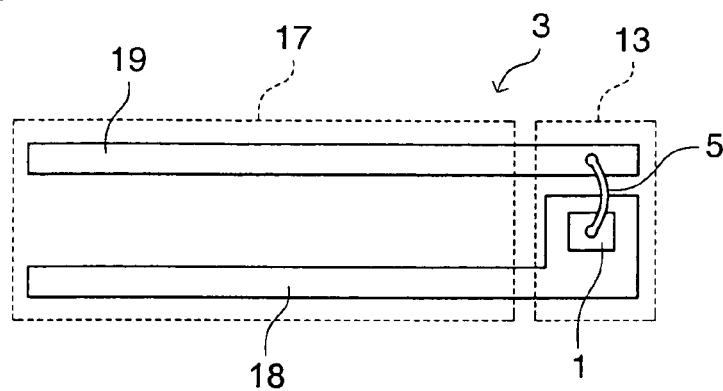
FIG. 3 is a plan view of a first lead frame according to the present invention.
Figure 4:
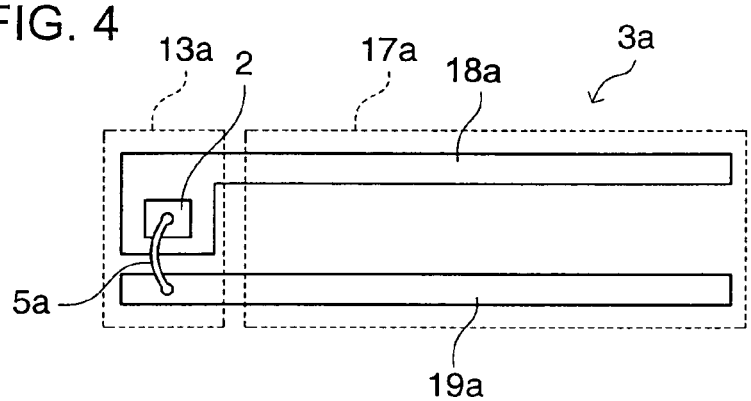
FIG. 4 is a plan view of a second lead frame according to the present invention.

FIGS. 3 and 4 are plan views respectively illustrating the first and second lead frames 3 and 3a. As shown in FIG. 3, the first lead frame 3 has the distal portion 13 and a main portion 17, and is divided into an element mount frame 18 and a signal frame 19 which are arranged in parallel relation.

The light emitting element 1 has two input terminals (electrodes). One of the input terminals of the light emitting element 1 is connected to a distal portion of the element mount frame 18, and the other input terminal is connected to a distal portion of the signal frame 19 via the gold wire 5.

As shown in FIG. 4, the second lead frame 3a has the distal portion 13a and a main portion 17a, and is divided into an element mount frame 18a and a signal frame 19a which are arranged in parallel relation. The light receiving element 2 has two output terminals (electrodes). One of the output terminals of the light receiving element 2 is connected to a distal portion of the element mount frame 18a, and the other output terminal is connected to a distal portion of the signal frame 19a via the gold wire 5a.

As shown in FIGS. 1 and 2, the distal portions 13, 13a of the first lead frame 3 and the second lead frame 3a are arranged in spaced opposed relation with the light emitting element 1 and the light receiving element 2 being respectively mounted on the upper surfaces thereof. The distal portions 13, 13a, the light emitting element 1 and the light receiving element 2 are covered with a transparent resin member 8 of a transparent epoxy resin, while the main portions 17, 17a are fixed in coplanar relation. Further, a opaque resin member 9 of a white epoxy resin covers the transparent resin member 8 to support the main portions 17, 17a.

The light emitting element 1 on the distal portion 13 is partly covered with a transparent resin member 6 of a silicone resin for protection thereof. A portion of the transparent resin member 8 above the light emitting element 1 and the light receiving element 2 has a generally hemispherical shape.

As shown in FIG. 2, the transparent resin member 8 includes an upper portion which guides light from the light emitting element 1 to the light receiving element 2, and a lower portion which supports the distal portions 13, 13a of the first and second lead frames 3, 3a. The upper portion has a smaller volume than the lower portion. Thus, the scattering of the light is suppressed, thereby improving the efficiency of the light transmission from the light emitting element to the light receiving element.

The distal portions 13, 13a respectively mounted with the light emitting element 1 and the light receiving element 2 are inclined downward at angles a and b, respectively, with respect to the main portions 17, 17a. With this arrangement, a part of the light emitted from the light emitting element 1 is directly incident on the light receiving element 2, and the rest of the light is reflected on a hemispherical surface 8a of the transparent resin member 8 and incident on the light receiving element 2. The configuration and the dimensions of the hemispherical surface 8a and the angles a and b are determined so as to maximize the total amount of the direct light and the reflected light incident on the light receiving element 2. The angles a and b herein satisfy the following expressions:

$$a<b,\ 5°\leq a\leq 30°,\ 5°\leq b\leq 40°$$

Figure 5:
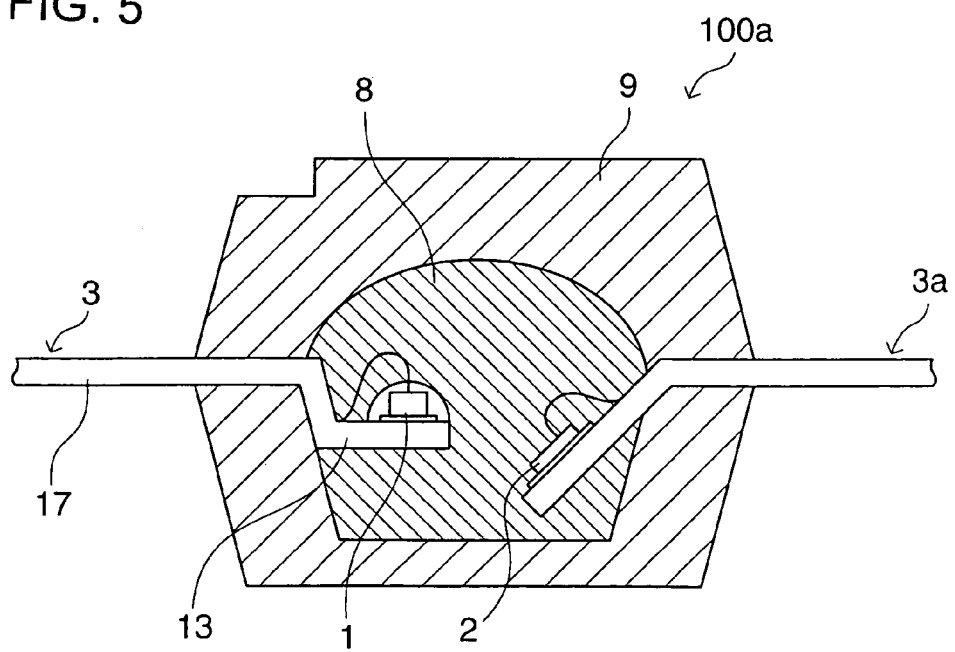
FIG. 5 is a sectional view illustrating a modification of the first embodiment as corresponding to FIG. 2.

FIG. 5 is a diagram illustrating a photo-coupler 100a modified from the photo-coupler 100 shown in FIGS. 1 and 2 and corresponding to FIG. 2.

The photo-coupler 100a has substantially the same construction as the photo-coupler 100, except that the first lead frame 3 has a stepped distal portion 13 such that the light emitting element 1 is located at a lower level than an upper surface of the main portion 17. The stepped distal portion 13 is configured and dimensioned so as to maximize the total amount of the direct light and the reflected light incident on the light receiving element 2.

Next, an explanation will be given to a production method for the photo-coupler shown in FIGS. 1 and 2.

Figure 6:
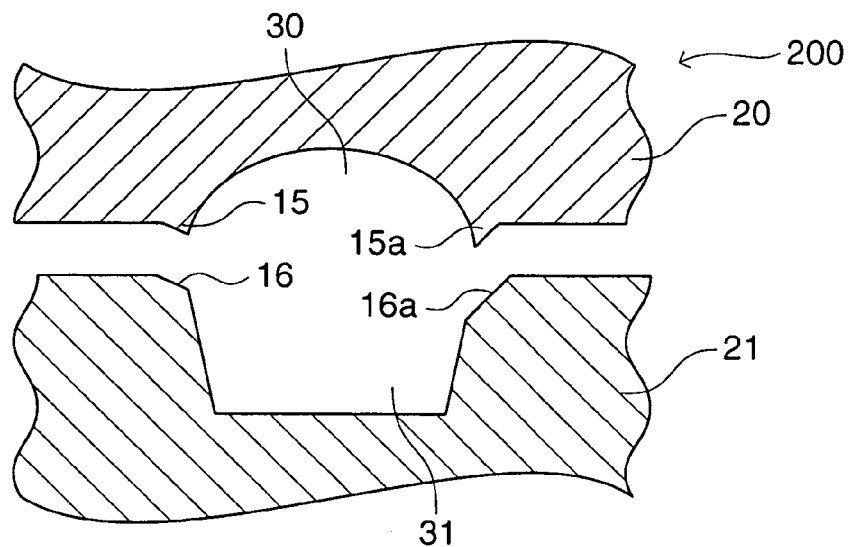
FIGS. 6 to 8 are sectional views of a mold for explaining a production method for the photo-coupler shown in FIG. 1.

FIG. 6 is a sectional view illustrating a major portion of a mold to be used for primary transfer molding in the production method. As shown, the mold 200 includes an upper mold half 20 and a lower mold half 21. The upper mold half 20 has a generally hemispherical cavity 30, while the lower mold half 21 has a generally cuboidal cavity 31. The cavity 30 has a mirror-finished interior wall.

The upper mold half 20 has projections 15, 15a provided on an edge of the cavity 30 for bending the lead frames. The lower mold half 21 has slant support portions 16, 16a provided on an edge of the cavity 31 for supporting the lead frames bent by the projections 15, 15a. The angles of the slant support portions 16, 16a respectively correspond to the angles a and b shown in FIG. 2.

Figure 9:
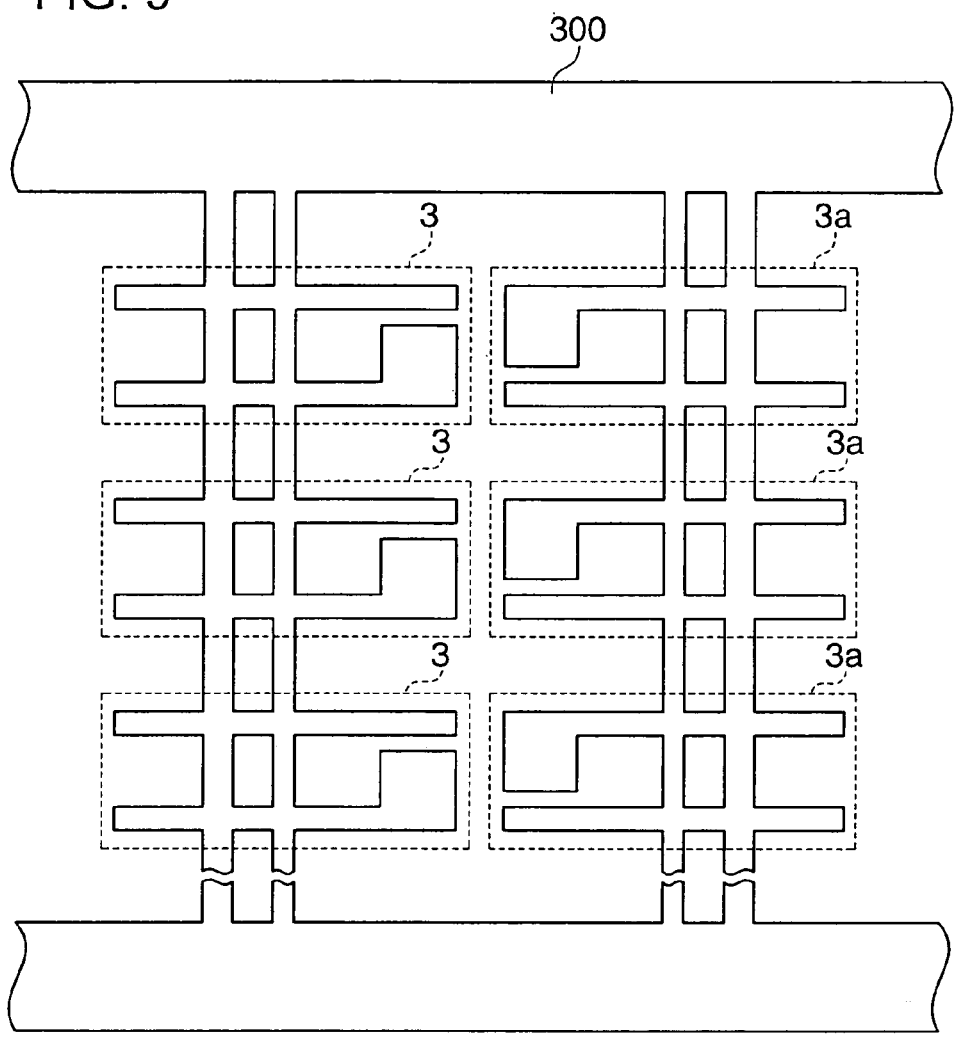
FIG. 9 is a plan view of a frame to be used for the photo-coupler production method.
Figure 10:
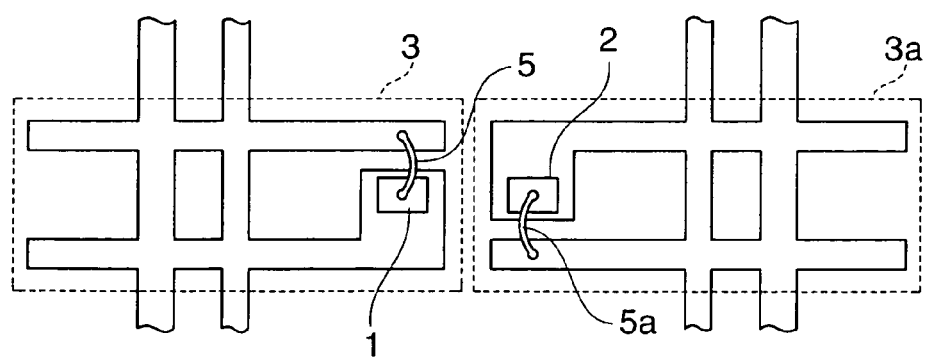
FIG. 10 is a diagram illustrating a major portion of FIG. 9 in detail.

First, a unitary frame 300 including plural pairs of first and second lead frames 3, 3a as shown in FIG. 9 is prepared. Then as shown in FIG. 10, a light emitting element 1 and a light receiving element 2 are respectively bonded to the distal portions of the first lead frame 3 and the second lead frame 3a in each of the pairs by a silver paste and electrically connected to the first lead frame 3 and the second lead frame 3a via gold wires 5, 5a. The light emitting element 1 is sealed with a silicone resin as shown in FIG. 2.

Figure 7:
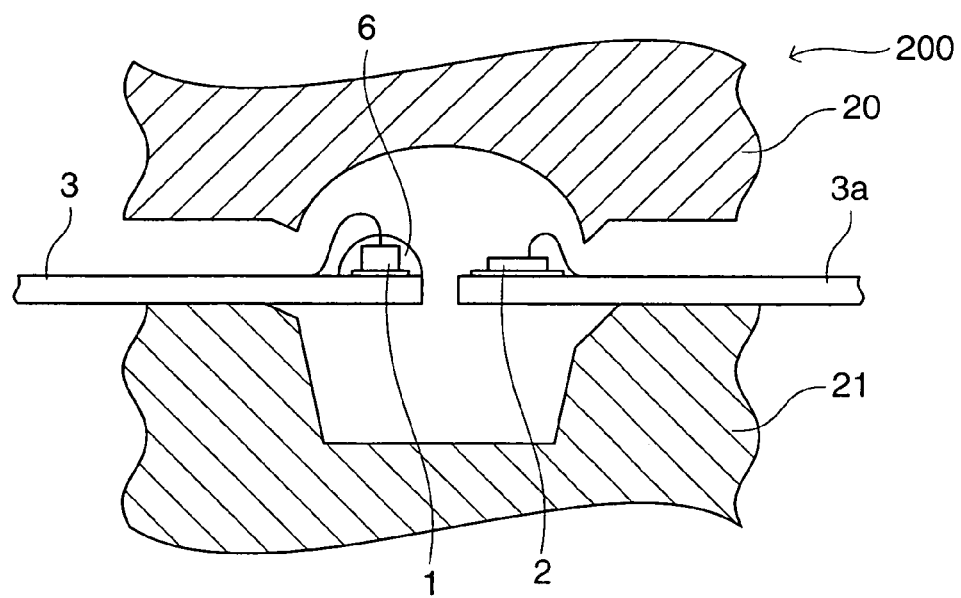
Figure 8:
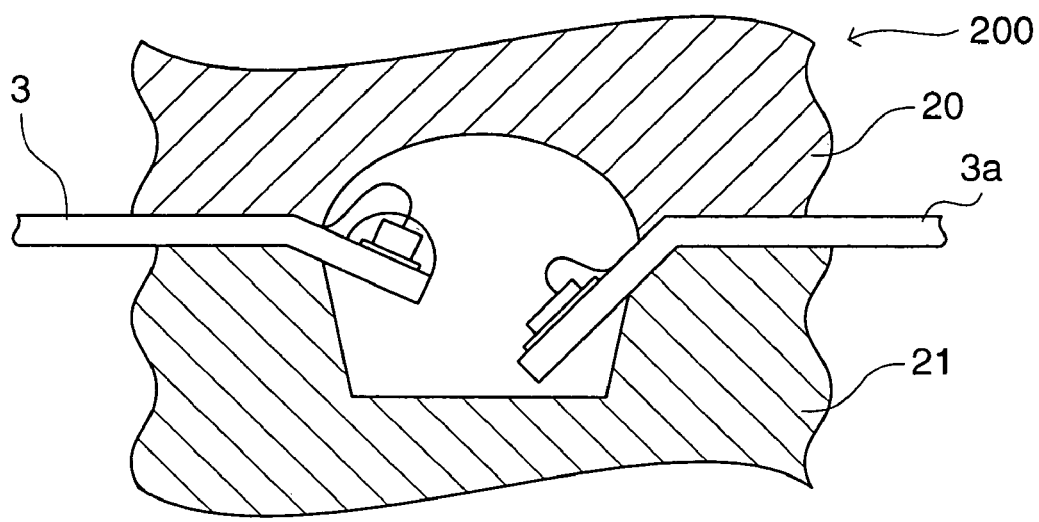

In turn, as shown in FIG. 7, the first and second lead frames 3, 3a are positioned between the upper mold half 20 and the lower mold half 21 of the mold 200 in an open state. Then, as shown in FIG. 8, the mold 200 is closed by lowering the upper mold half 20 (and clamped). The distal portions of the lead frames 3, 3a are pressed down by the projections 15, 15a and received by the support portions 16, 16a thereby to be simultaneously bent at the predetermined angles. That is, the element mount frames 18, 18a and the signal frames 19, 19a of the lead frames 3, 3a shown in FIGS. 3 and 4 are simultaneously bent.

Subsequently, the transparent epoxy resin is filled in the cavities 30, 31 for the primary transfer molding. After the transparent epoxy resin is cured, the mold 200 is opened, and a primary transfer-molded product is taken out.

In turn, the primary transfer-molded product is set in a mold for secondary transfer molding, and then the white epoxy resin is filled in the mold. Thus, the opaque resin member 9 shown in FIGS. 1 and 2 is formed by the secondary transfer molding. After the white epoxy resin is cured, a secondary transfer-molded product is taken out. Thus, the photo-coupler 100 shown in FIGS. 1 and 2 is provided.

Second Embodiment

Figure 11:
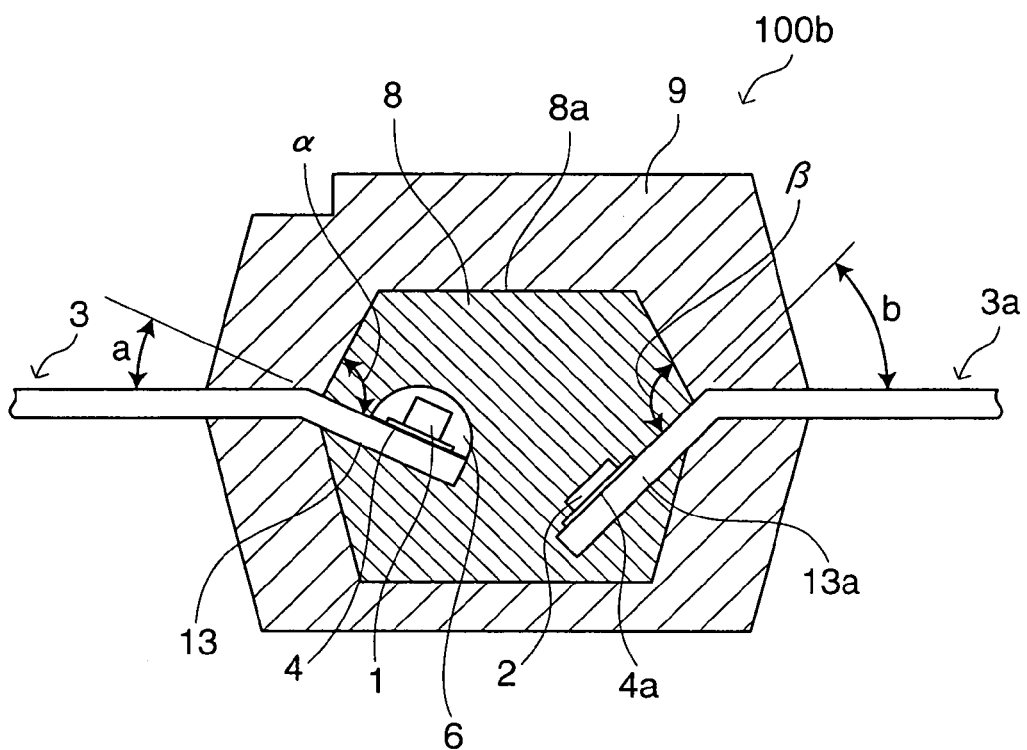
FIG. 11 is a diagram illustrating a photo-coupler according to a second embodiment of the present invention as corresponding to FIG. 2.

FIG. 11 is a diagram illustrating a photo-coupler according to a second embodiment of the present invention as corresponding to FIG. 2.

The photo-coupler 100b has substantially the same construction as the photo-coupler 100 shown in FIG. 2, except that the portion of the transparent resin member 8 above the light emitting element 1 and the light receiving element 2 has a generally truncated quadrangular pyramid shape and the upper surfaces of the distal portions 13, 13a of the first and second lead frames 3, 3a respectively form angles α, β of 45 to 90 degrees with respect to outer peripheral surface portions of the transparent resin member 8 adjacent thereto.

This arrangement makes it possible to produce the mold for the primary transfer molding at lower costs without the need for special processing which is otherwise required for mirror-finishing the hemispherical surface of the mold for the molding of the transparent resin member 8. Therefore, the costs for the production facility can be reduced, so that the flat-surface-mountable photo-coupler having a double transfer-molded structure can be produced at lower costs.

The photo-coupler 100a shown in FIG. 5 may also be modified so that the portion of the transparent resin member 8 above the light emitting element 1 and the light receiving element 2 has a generally truncated quadrangular pyramid shape as shown in FIG. 11. The photo-coupler 100a thus modified provides the same effects as the photo-coupler 100b shown in FIG. 11.

Next, an explanation will be given to a production method for the photo-coupler 100b shown in FIG. 11.

Figure 12:
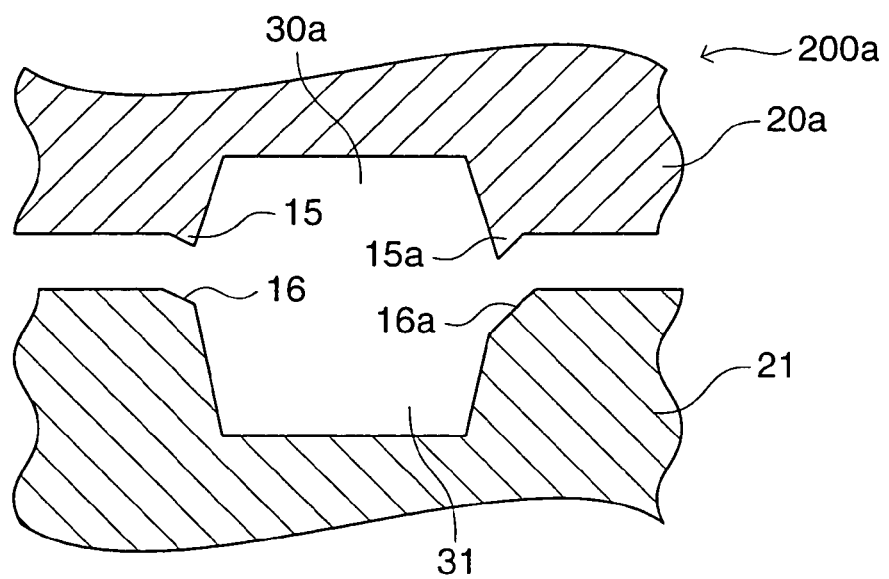
FIGS. 12 to 25 are sectional views of molds for explaining production methods for the photo-coupler shown in FIG. 11.

FIG. 12 is a sectional view illustrating a major portion of a mold to be used for the primary transfer molding in the production method. As shown, the mold 200a includes an upper mold half 20a and a lower mold half 21. The upper mold half 20a has a cavity 30a having a generally truncated quadrangular pyramid shape, while the lower mold half 21 has a cavity 31 having a generally cuboidal shape. The lower mold half 21 has the same construction as that shown in FIG. 6. There is no need for mirror-finishing the surface of the cavity 30a unlike the surface of the cavity 30 (FIG. 6).

The upper mold half 20a has projections 15, 15a provided on an edge of the cavity 30a for bending the lead frames like the upper mold half 20 shown in FIG. 6.

First, a unitary frame 300 including plural pairs of first and second lead frames 3, 3a as shown in FIG. 9 is prepared. Then as shown in FIG. 10, a light emitting element 1 and a light receiving element 2 are respectively bonded to the distal portions of the first lead frame 3 and the second lead frame 3a in each of the pairs by a silver paste and electrically connected to the first lead frame 3 and the second lead frame 3a via gold wires 5, 5a. The light emitting element 1 is sealed with a silicone resin as shown in FIG. 11.

Figure 13:
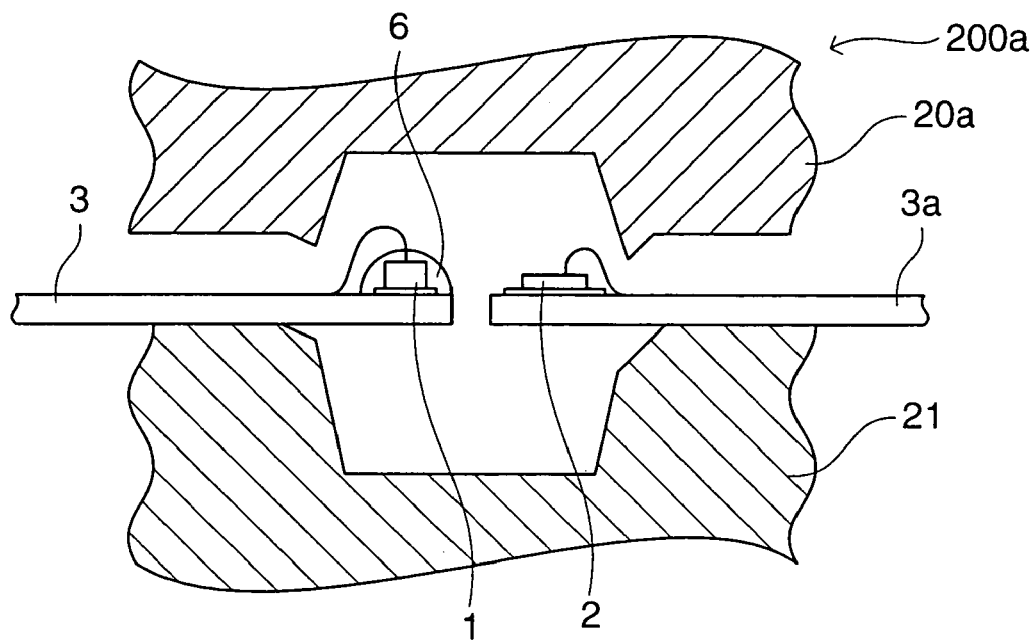
Figure 14:
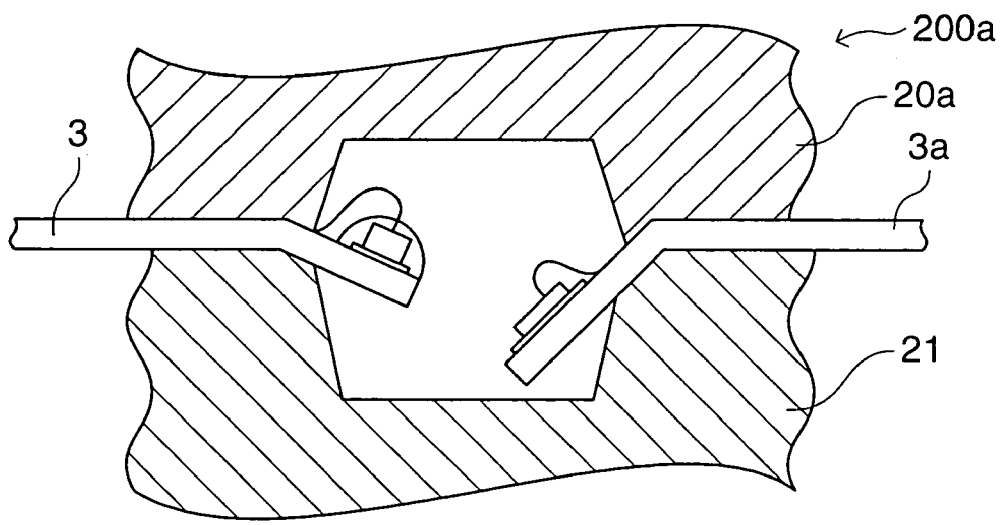

In turn, as shown in FIG. 13, the first and second lead frames 3, 3a are positioned between the upper mold half 20a and the lower mold half 21 of the mold 200a in an open state. Then, as shown in FIG. 14, the mold 200a is closed by lowering the upper mold half 20a (and clamped). The distal portions of the lead frames 3, 3a are pressed down by the projections 15, 15a and received by the support portions 16, 16a thereby to be simultaneously bent at the predetermined angles.

Subsequently, the transparent epoxy resin is filled in the cavities 30a, 31 for the primary transfer molding. After the transparent epoxy resin is cured, the mold 200a is opened, and a primary transfer-molded product is taken out.

In turn, the primary transfer-molded product is set in a mold for secondary transfer molding, and then the white epoxy resin is filled in the mold. Thus, the opaque resin member 9 shown in FIG. 11 is formed by the secondary transfer molding. After the white epoxy resin is cured, a secondary transfer-molded product is taken out. Thus, the photo-coupler 100b shown in FIG. 11 is provided.

Figure 15:
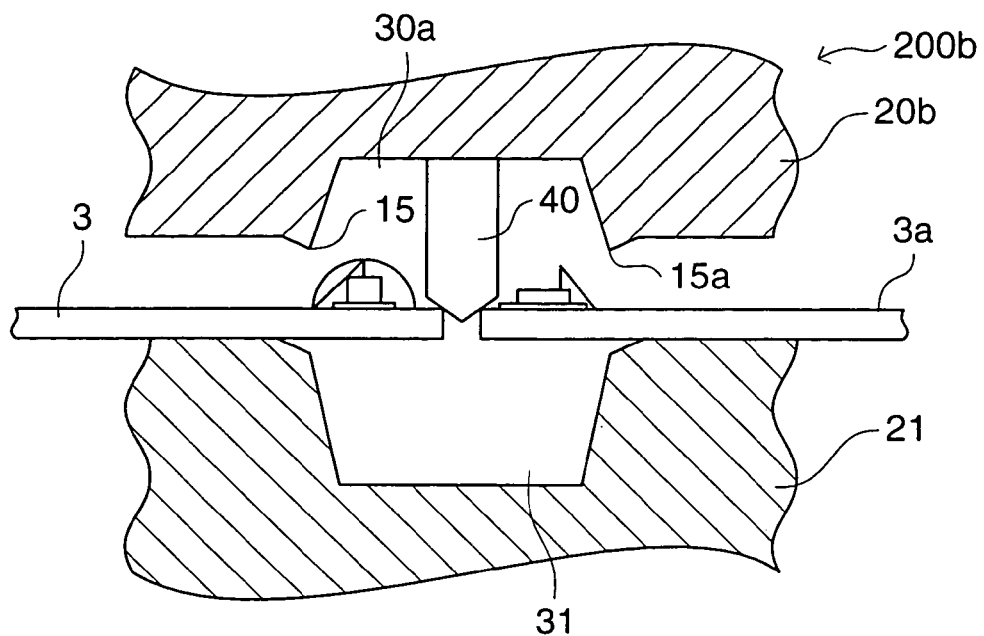

FIG. 15 is a sectional view of a major portion of a mold 200b modified from the mold 200a (FIG. 12). The mold 200b includes an upper mold half 20b and a lower mold half 21 (having the same construction as that shown in FIG. 12). The mold 200b has substantially the same construction as the mold 200a, except that the upper mold half 20b has a pin 40 projecting downward in the center of the cavity 30a.

Figure 16:
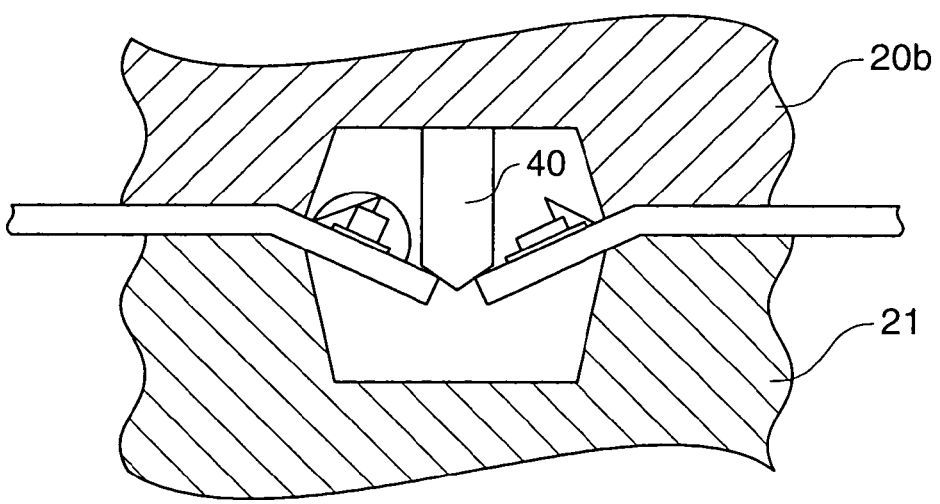

The first and second lead frames 3, 3a are positioned in the mold 200b as shown in FIG. 15. When the mold 200b is clamped as shown in FIG. 16, the distal portions 13, 13a of the lead frames 3, 3a are smoothly pressed down by the pin 40 and the projections 15, 15a thereby to be bent at the predetermined angles. Thereafter, the same steps as described above are performed thereby to provide the photo-coupler 100b shown in FIG. 11.

Figure 17:
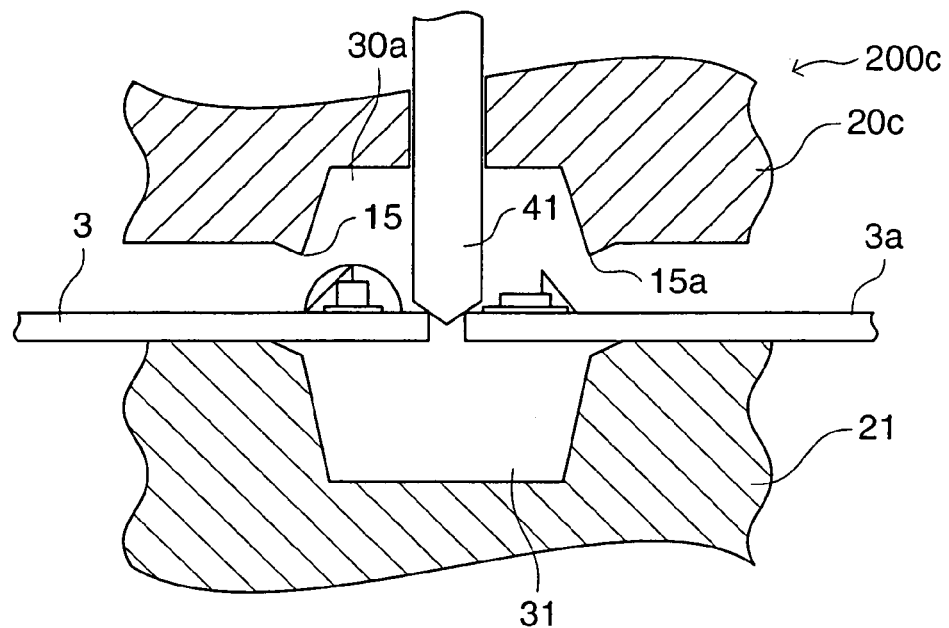

FIG. 17 is a sectional view of a major portion of another mold 200c modified from the mold 200a (FIG. 12). The mold 200c includes an upper mold half 20c and a lower mold half 21 (having the same construction as that shown in FIG. 12). The mold 200c has substantially the same construction as the mold 200a, except that the upper mold half 20c has a pin 41 movable to project downward into the center of the cavity 30a.

Figure 18:
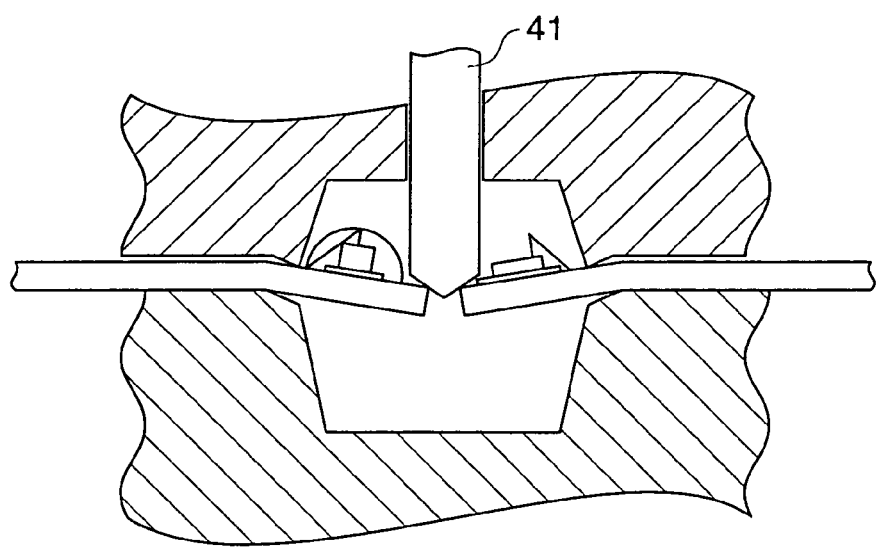
Figure 19:
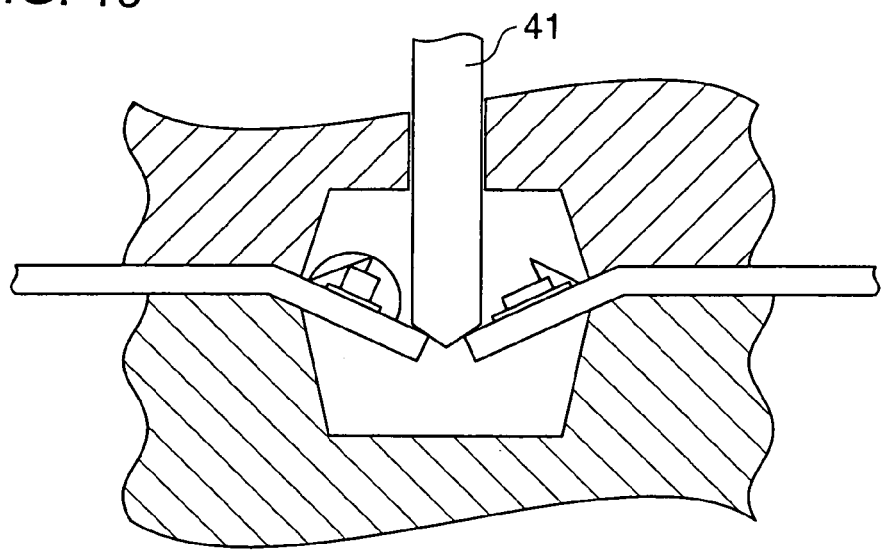

The first and second lead frames 3, 3a are positioned in the mold 200c as shown in FIG. 17. Then, the mold 200c is clamped, while the movable pin 41 is moved down as shown in FIGS. 18 and 19. Thus, the distal portions 13, 13a of the lead frames 3, 3a are smoothly pressed down by the movable pin 41 and the projections 15, 15a thereby to be bent at the predetermined angles. Then, the movable pin 41 is retracted in the wall of the upper mold half 20c. Thereafter, the same steps as described above are performed thereby to provide the photo-coupler 100b shown in FIG. 11. It is noted that the movable pin 41 is hydraulically driven.

Figure 20:
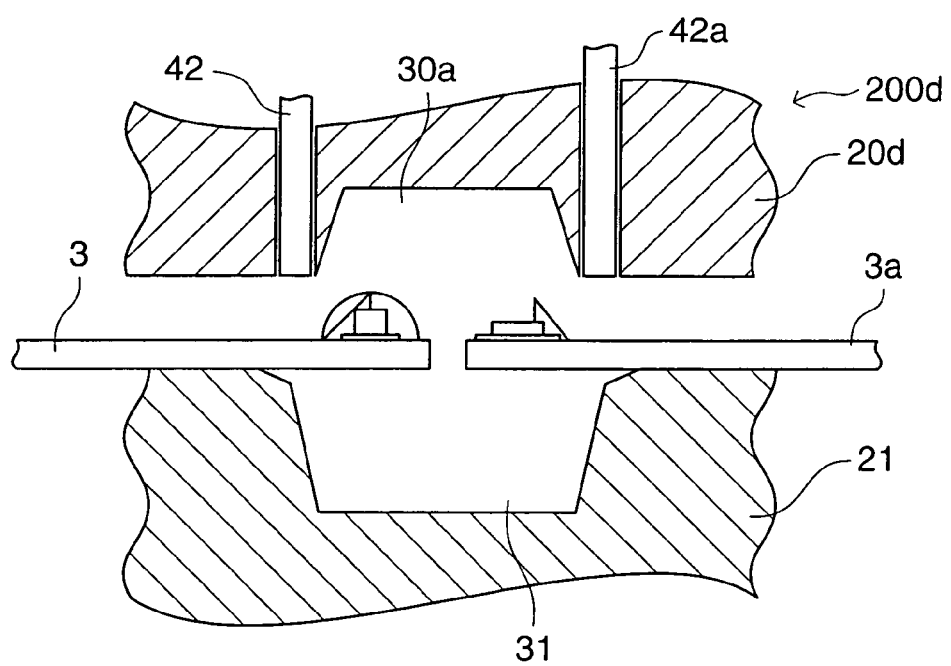

FIG. 20 is a sectional view of a major portion of further another mold 200d modified from the mold 200a (FIG. 12). The mold 200d includes an upper mold half 20d and a lower mold half 21 (having the same construction as that shown in FIG. 12). The mold 200d has substantially the same construction as the mold 200a (FIG. 12), except that the upper mold half 20d includes, instead of the projections 15, 15a shown in FIG. 12, pins 42, 42a which are movable to project downward.

Figure 21:
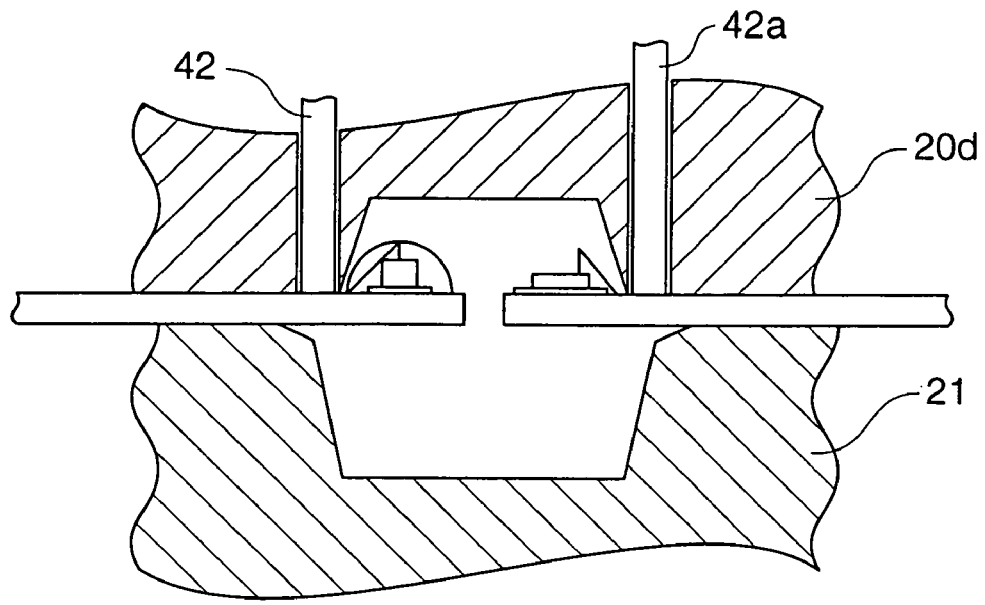
Figure 22:
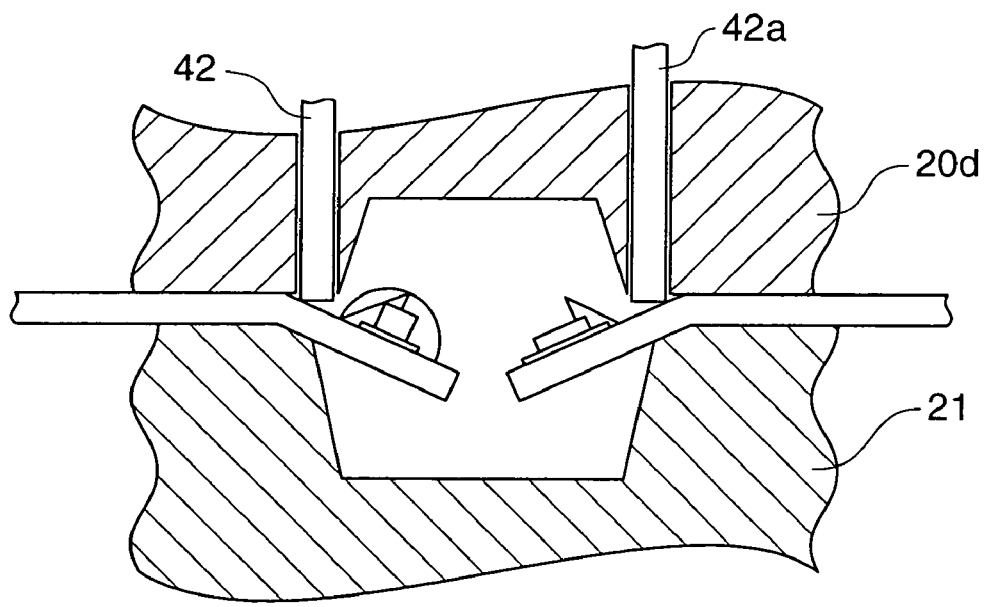

The first and second lead frames 3, 3a are positioned in the mold 200d as shown in FIG. 20. After the mold 200d is clamped as shown in FIG. 21, the movable pins 42, 42a are moved down as shown in FIG. 22. Thus, the distal portions 13, 13a of the lead frames 3, 3a are smoothly pressed down by the movable pins 42, 42a thereby to be bent at the predetermined angles. Then, the movable pins 42, 42a are retracted in the wall of the upper mold half 20d as shown in FIG. 20. Thereafter, the same steps as described above are performed thereby to provide the photo-coupler 100b shown in FIG. 11. It is noted that the movable pins 42, 42a are hydraulically driven.

Figure 23:
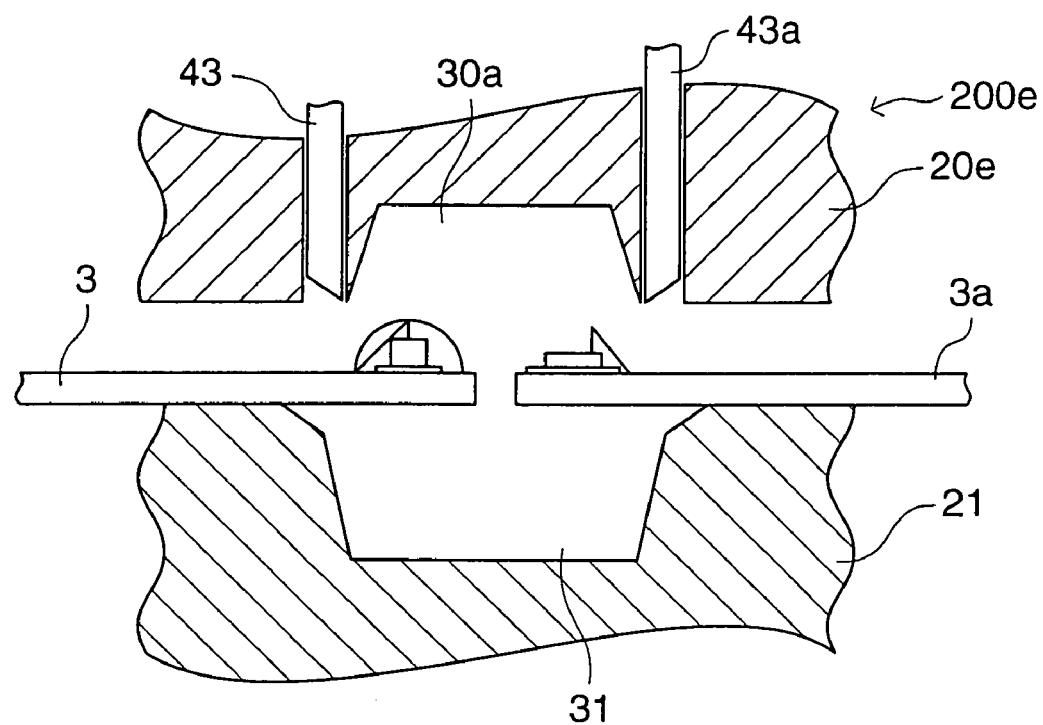

FIG. 23 is a sectional view of a major portion of still another mold 200e modified from the mold 200a (FIG. 12). The mold 200e includes an upper mold half 20e and a lower mold half 21 (having the same construction as that shown in FIG. 12). The mold 200e has substantially the same construction as the mold 200a, except that the upper mold half 20e includes, instead of the projections 15, 15a shown in FIG. 12, pins 43, 43a which are movable to project downward. The movable pins 43, 43a respectively have distal ends tapered correspondingly to the bending angles.

Figure 24:
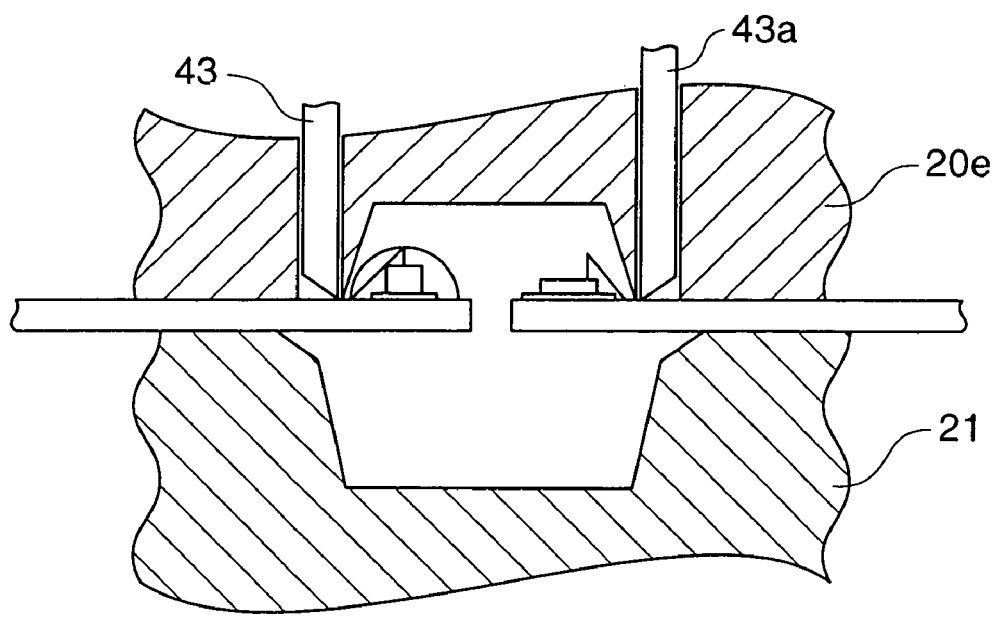
Figure 25:
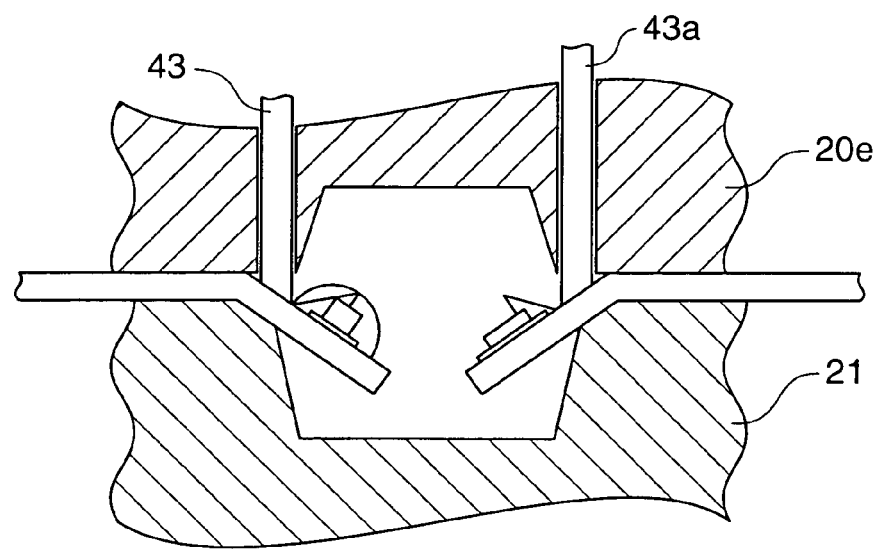

The first and second lead frames 3, 3a are positioned in the mold 200e as shown in FIG. 23. After the mold 200e is clamped as shown in FIG. 24, the movable pins 43, 43a are moved down as shown in FIG. 25. Thus, the distal portions 13, 13a of the lead frames 3, 3a are smoothly pressed down by the movable pins 43, 43a thereby to be bent at the predetermined angles. Then, the movable pins 43, 43a are retracted in the wall of the upper mold half 20e as shown in FIG. 23. Thereafter, the same steps as described above are performed thereby to provide the photo-coupler 100b shown in FIG. 11. It is noted that the movable pins 43, 43a are hydraulically driven.

Figure 26:
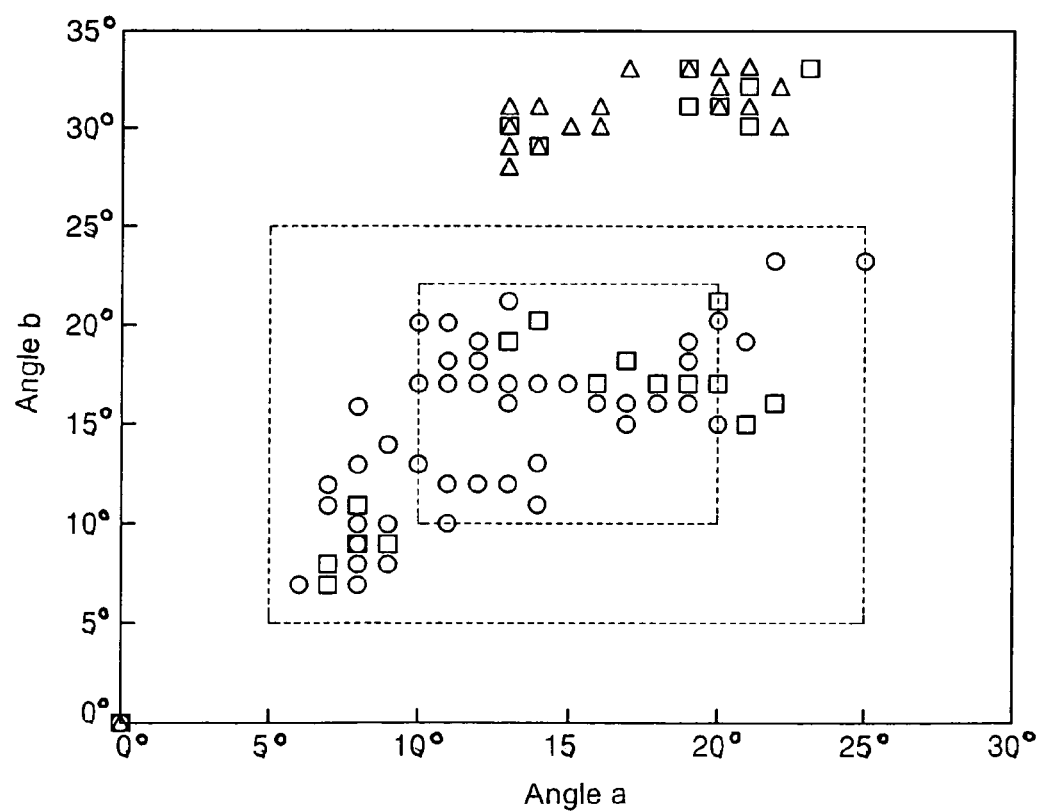
FIG. 26 is a graph for explaining the sensitivity of the photo-coupler shown in FIG. 11.

FIG. 26 is a graph illustrating a relationship among the bending angle a of the distal portion 13 of the first lead frame 3, the bending angle b of the distal portion 13a of the second lead frame 3a and the sensitivity of the photo-coupler 100b determined on the basis of actual measurement. The output current of the light receiving element 2 was measured, while a rated current was applied to the light emitting element 1. In the graph, combinations of the angles a and b providing a standard output current level are plotted at square marks, and combinations of the angles a and b providing output current levels higher than the standard level are plotted at round marks. Combinations of the angles a and b providing output current levels lower than the standard level are plotted at triangle marks.

As can be seen from FIG. 26, the angles a and b are preferably in the ranges of $5° \leq a \leq 25°$, $5° \leq b \leq 25°$, respectively, more preferably in the ranges of $10° \leq a \leq 20°$, $10° \leq b \leq 20°$, respectively, to ensure that the light receiving element 2 has an output current level not lower than the standard level.

The photo-couplers (photo-coupler semiconductor devices) described above are advantageously employed for a TV power supply and a portable-phone charger.

What is claimed is:

1. A photo-coupler semiconductor device comprising:
   first and second planar lead frames each having a main portion and a distal portion;
   a light emitting element and a light receiving element respectively mounted on upper surfaces of the distal portions of the first and second lead frames;
   a light-transmitting resin member which covers the light emitting element and the light receiving element, and supports the distal portions of the first and second lead frames on the lower surfaces of the distal portions, with the light emitting element and the light receiving element being mounted on the upper surfaces opposite of the respective lower surfaces of the distal portions and the main portions of the first and second lead frames being located in coplanar relation; and
   a opaque resin member which covers the light-transmitting resin member, and supports the main portions of the first and second lead frames; wherein the light-transmitting resin member and the opaque resin member are each composed of an epoxy resin as a base resin,
   wherein the distal portion mounted with the light emitting element is inclined downward at an angle a with respect to the respective main portion, and the distal portion mounted with the light receiving element is inclined downward at an angle b with respect to the respective main portion, wherein the angles a and b satisfy the following expressions:

$$5° \leq a \leq 25°, 5° \leq b \leq 25°.$$

2. A photo-coupler semiconductor device as set forth in claim 1, wherein a portion of the light-transmitting resin member above the light emitting element and the light receiving element has a generally hemispherical shape.

3. A photo-coupler semiconductor device as set forth in claim 1, wherein a portion of the light-transmitting resin member above the light emitting element and the light receiving element has a generally truncated quadrangular pyramid shape.

4. A photo-coupler semiconductor device as set forth in claim 3, wherein the light-transmitting resin member has an outer peripheral surface, and the upper surfaces of the distal portions each form an angle of 45 to 90 degrees with respect to a portion of the outer peripheral surface adjacent thereto.

5. A photo-coupler semiconductor device as set forth in claim 1, wherein the distal portion mounted with the light emitting element is inclined at a smaller angle than the distal portion mounted with the light receiving element.

6. A photo-coupler semiconductor device as set forth in claim 1, wherein the light-transmitting resin member includes an upper portion which guides light from the light emitting element to the light receiving element, and a lower portion which supports the distal portions of the first and second lead frames, and the upper portion is smaller in volume than the lower portion.

7. A photo-coupler semiconductor device as set forth in claim 1, wherein the first lead frame has a step provided adjacent the distal portion thereof so that the light emitting element is located at a lower level than an upper surface of the main portion of the first lead frame.

8. A photo-coupler semiconductor device as set forth in claim 1, wherein the light emitting element is partly covered with a light-transmitting silicone resin.

9. An electronic apparatus comprising a photo-coupler semiconductor device as recited in claim 1.

* * * * *